United States Patent
Chen et al.

(10) Patent No.: US 9,942,976 B2
(45) Date of Patent: Apr. 10, 2018

(54) PREPARATION METHOD OF A BOSS-TYPE METAL-BASED SANDWICH RIGID-FLEX CIRCUIT BOARD

(71) Applicants: Guangzhou Fastprint Circuit Tech Co., Ltd, Guangzhou, Guangdong (CN); Shenzhen Fastprint Circuit Tech Co., Ltd., Shenzhen, Guangdong (CN); Yixing Silicon Valley Electronics Technology Co., Ltd., Yixing, Jiangsu (CN)

(72) Inventors: Bei Chen, Guangdong (CN); Bo Xu, Guangdong (CN); Xinman Mo, Guangdong (CN)

(73) Assignees: Guangzhou Fastprint Circuit Tech Co., Ltd., Guangdong (CN); Shenzhen Fastprint Circuit Tech Co., Ltd., Guangdong (CN); Yixing Silicon Valley Electronics Technology Co., Ltd., Jiangsu (CN)

(*) Notice: Subject to any disclaimer, the term of this patent is extended or adjusted under 35 U.S.C. 154(b) by 0 days.

(21) Appl. No.: 15/039,492

(22) PCT Filed: Nov. 25, 2014

(86) PCT No.: PCT/CN2014/092105
§ 371 (c)(1),
(2) Date: May 26, 2016

(87) PCT Pub. No.: WO2015/078345
PCT Pub. Date: Jun. 4, 2015

(65) Prior Publication Data
US 2016/0381783 A1    Dec. 29, 2016

(30) Foreign Application Priority Data
Nov. 26, 2013  (CN) .......................... 2013 1 0612125

(51) Int. Cl.
*H05K 3/20*   (2006.01)
*H05K 1/02*   (2006.01)
(Continued)

(52) U.S. Cl.
CPC ........... *H05K 1/0204* (2013.01); *H05K 1/028* (2013.01); *H05K 1/0298* (2013.01); *H05K 1/05* (2013.01);
(Continued)

(58) Field of Classification Search
CPC .... H05K 1/0204; H05K 1/028; H05K 1/0298; H05K 1/05; H05K 3/44; H05K 3/4691;
(Continued)

(56) References Cited

U.S. PATENT DOCUMENTS 5,638,597 A * 6/1997 Cutting ............... H01L 21/4857
                                                  29/830
6,376,908 B1 * 4/2002 Gaku .................... H01L 23/13
                                                  257/701
(Continued)

FOREIGN PATENT DOCUMENTS

CN  101035407 A   9/2007
CN  101677488 A   3/2010
(Continued)

OTHER PUBLICATIONS

International Search Report and Written Opinion, International application No. PCT/CN2014/092105. dated Feb. 11, 2015. SIPO, Beijing, China.

*Primary Examiner* — Donghai D Nguyen
(74) *Attorney, Agent, or Firm* — Coats & Bennett, PLLC

(57) ABSTRACT

A boss-type metal-based sandwich rigid-flex board and preparation method thereof are disclosed. The boss-type metal-based sandwich rigid-flex board comprises a rigid sub-plate, a flexible sub-plate, a dielectric layer, and a metal
(Continued)

core layer, wherein the metal core layer has front and back sides on which at least one metal boss and at least one heat dissipation area are arranged respectively, the dielectric layer, and the rigid sub-plate and/or the flexible sub-plate are sequentially stacked on the front and back sides of the metal core layer respectively, and each of the rigid sub-plate, the flexible sub-plate and the dielectric layer is provided with a first window area fit with the metal boss, and a second window area corresponding to the heat dissipation area. The boss-type metal-based sandwich rigid-flex board (with a metal boss and a heat dissipation area arranged on the front side) prepared according to the present disclosure uses a metal core layer for heat dissipation. In this way, not only the need of heat dissipation of the locally heating electronic components (through the metal boss) but also the heat dissipation of the high density wirings at work can be satisfied (through the metal core layer and the heat dissipation area) with good reliability.

4 Claims, 3 Drawing Sheets

(51) Int. Cl.
H05K 3/46 (2006.01)
H05K 1/05 (2006.01)
H05K 3/44 (2006.01)
H05K 3/00 (2006.01)

(52) U.S. Cl.
CPC .............. *H05K 3/44* (2013.01); *H05K 3/4691* (2013.01); *H05K 1/0207* (2013.01); *H05K 3/0061* (2013.01); *H05K 2201/09054* (2013.01)

(58) Field of Classification Search
CPC ....... H05K 3/0061; H05K 2201/09054; H05K 1/0207; H01L 21/4857; Y10T 29/49165; Y10T 29/49126; Y10T 29/49128; Y10T 29/49155; Y10T 29/4935
USPC ........... 29/830, 831, 846, 852; 257/675, 717
See application file for complete search history.

(56) References Cited

U.S. PATENT DOCUMENTS

| | | | | |
|---|---|---|---|---|
| 8,288,792 B2* | 10/2012 | Lin | ...................... | H05K 1/0204 257/717 |
| 8,310,043 B2* | 11/2012 | Lin | ...................... | H01L 21/486 257/706 |
| 2002/0189853 A1* | 12/2002 | Hsu | ...................... | H01L 23/3677 174/252 |
| 2003/0189830 A1* | 10/2003 | Sugimoto | ........... | H01L 25/0753 362/294 |
| 2007/0212529 A1 | 9/2007 | Cho et al. | | |
| 2010/0200277 A1 | 8/2010 | Huang et al. | | |
| 2011/0075374 A1 | 3/2011 | Kang et al. | | |

FOREIGN PATENT DOCUMENTS

| | | |
|---|---|---|
| CN | 101686611 A | 3/2010 |
| CN | 102404933 A | 4/2012 |
| CN | 202551494 U | 11/2012 |
| CN | 102938971 A | 2/2013 |
| CN | 103079364 A | 5/2013 |
| CN | 203618217 U | 5/2014 |

* cited by examiner

PREPARATION METHOD OF A BOSS-TYPE METAL-BASED SANDWICH RIGID-FLEX CIRCUIT BOARD

FIELD

The present disclosure relates generally to the technical field of print circuit board, and more particularly, to a boss-type metal-based sandwich rigid-flex board and preparation method thereof.

BACKGROUND

With the development of high-speed transmission, as well as precise and miniaturized design of electronic products, the heat density generated in the electronic product keeps increasing. Thus, heat dissipation performance of the product becomes a key performance index. As an important member of components of electronic products, poor heat dissipation of the rigid-flex board products may reduce the electrical performance of the components, or even result in destruction of the product. Thus, a rigid-flex board product with good heat dispersion performance determines its importance role in the application more significantly.

In order to solve the problem of heat dissipation, there are several methods applied in PCB products each having some shortages that it is difficult to satisfy the requirement of high-efficiency cooling for a rigid-flex board product, including:

(1) a board combined of a copper seat or an aluminum seat and a PCB, in which a single-layer or multilayer PCB is grafted with a copper seat or an aluminum seat that only the contact region of the PCB plays a role in heat dissipation, (2) an aluminum or copper base board, generally a single sided board in which one side is used for circuit, and the other side is used for heat dissipation, so that the number of circuit layers is limited;

(3) a conductive heat dissipation silver or copper paste board, in which heat from the surface electronic elements can be quickly transferred to a corresponding grounded large copper surface for heat dissipation, by a hole clogging technique with aluminum or copper base with a certain heat-conducting property, which has high cost, particularly of the large copper surface;

(4) a PCB with buried copper block, in which a copper block is embedded in a multilayer PCB for local heat dissipation, but the CTE of the copper block does not match that of the dielectric layer of the PCB, so that the reliability is limited; and (5) a metal-based sandwich PCB, as a development version of the PCB with buried copper block, in which a metal core layer as a separate non-circuit layer is pressed together with a circuit layer of the PCB so that hear can be dissipated around the board; but it is difficult to process the metal core as a separate layer, and it is difficult to guarantee the reliability.

SUMMARY

Based on the above, it is an objective of the present disclosure to provide a boss-type metal-based sandwich rigid-flex board.

The specific technical solution is as below:

a boss-type metal-based sandwich rigid-flex board, including a rigid sub-plate, a flexible sub-plate, a dielectric layer, and a metal core layer, wherein the metal core layer has front and back sides on which at least one metal boss and at least one heat dissipation area are arranged respectively, the dielectric layer, and the rigid sub-plate and/or the flexible sub-plate are sequentially stacked on the front and back sides of the metal core layer respectively, and each of the rigid sub-plate, the flexible sub-plate and the dielectric layer is provided with a first window area fit with the metal boss, and a second window area corresponding to the heat dissipation area.

In one embodiment, each edge of the first window area has a size larger than each edge of the metal boss by 0.1-0.2 mm.

In one embodiment, a difference between the thickness of the metal boss and a total thickness of the embracing dielectric layer, the rigid sub-plate and/or the flexible sub-plate is kept within ±20 µm.

In one embodiment, the rigid sub-plate is a single-layer rigid plate or a multilayer rigid plate, and the flexible sub-plate is a single-layer flexible plate or a multilayer flexible plate.

It is another objective of the present disclosure to provide a preparation method for the above boss-type metal-based sandwich rigid-flex board.

The specific technical solution is as below:

A preparation method for the above boss-type metal-based sandwich rigid-flex board, including the steps of:

(1) making a flexible sub-plate, obtained from a flexible board by inner circuit processing and windowing according to a conventional method;

(2) making a rigid sub-plate, obtained from a rigid board by inner circuit processing and windowing according to a conventional method;

(3) making a dielectric layer, obtained from a dielectric material by windowing according to a conventional method;

(4) making a metal core layer, including:

① performing hole drilling, hole clogging and location hole punching on a metal core plate;

② front side controlled deep milling, including performing controlled deep milling on the metal core plate obtained from the step of ①, to form a metal boss on a front side of the metal core plate; and ③ back side controlled deep milling, including mounting a backing plate on the front side of the metal core plate, and performing controlled deep milling a back side of the metal core plate, to form a metal boss on the back side, to complete the metal core layer;

(5) stacking the rigid sub-plate, the flexible sub-plate, the dielectric layer and the metal core layer sequentially according to design requirements, and performing laminating; and (6) performing subsequent processing as normal, and performing controlled deep milling and cover opening for the second window area after resistance welding, to obtain the boss-type metal-based sandwich rigid-flex board.

In one embodiment, in the step (4), the backing plate has a thickness equal to that of the metal boss, and the backing plate is provided with a groove area fit with the metal boss.

In one embodiment, each edge of the groove area has a size larger than each edge of the metal boss by 0.1-0.2 mm.

In one embodiment, in the steps (4) and (6), the processing of controlled deep milling has a precision of 0.1 mm.

The present disclosure has the following advantages.

The boss-type metal-based sandwich rigid-flex board (with a metal boss and a heat dissipation area arranged on the front side) prepared according to the present disclosure uses a metal core layer for heat dissipation. In this way, not only the need of heat dissipation of from the locally heating electronic components can be satisfied (through the metal boss), but also the need of heat dissipation of the high density wirings at work can be satisfied (through the metal core layer and the heat dissipation area) with good reliability.

DESCRIPTION OF REFERENCE SIGNS

101 rigid sub-plate; 102 metal boss; 103 flexible sub-plate; 104 metal core layer; 105 dielectric layer; and 106 heat dissipation area.

DETAILED DESCRIPTION OF THE PREFERRED EMBODIMENTS

The present disclosure may be best understood by reference to the following description taken in conjunction with the accompanying drawings.

Figure 1:
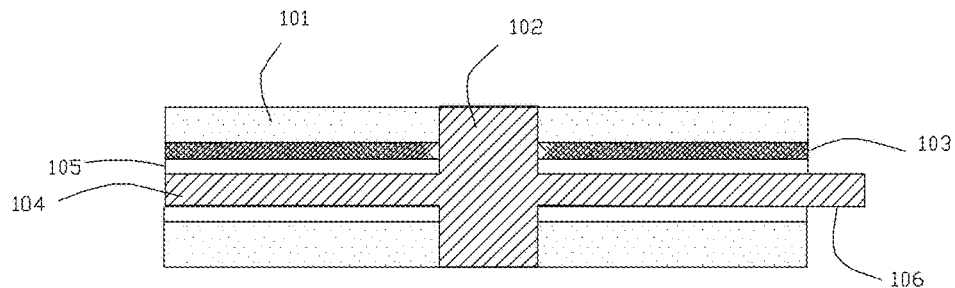
FIG. 1 is a schematic diagram showing a cross section of a boss-type metal-based sandwich rigid-flex board according to the present disclosure.
Figure 2:
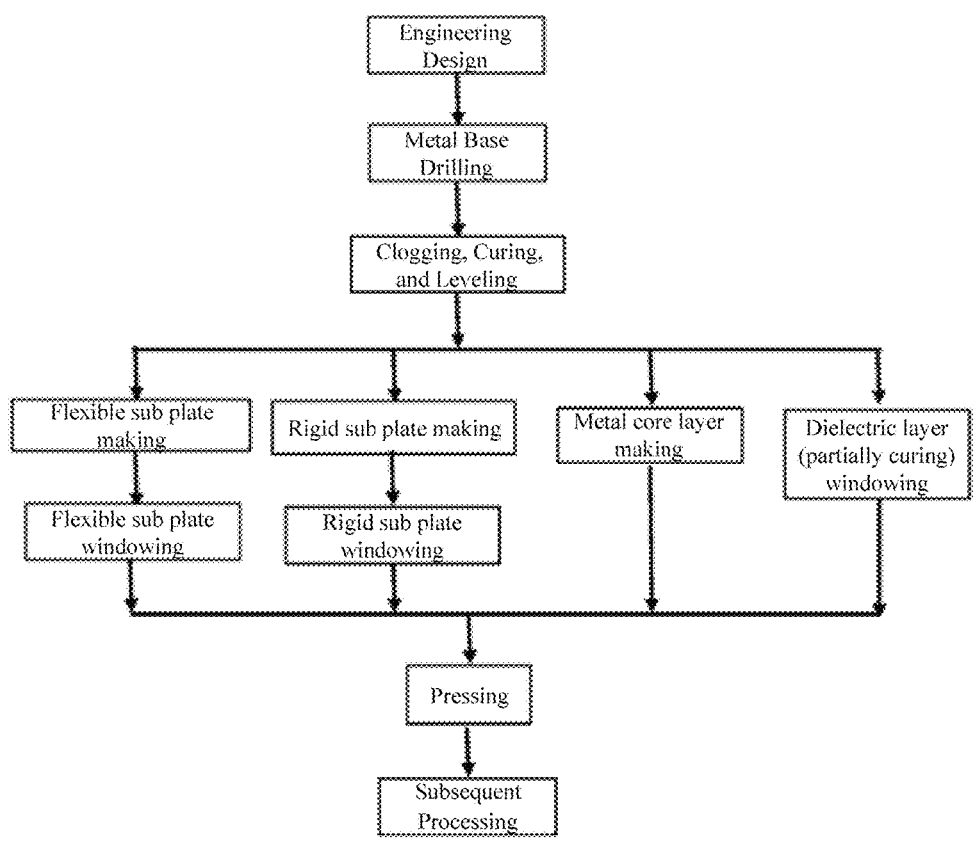
FIG. 2 is a flow diagram showing a preparation of a boss-type metal-based sandwich rigid-flex board according to the present disclosure.

Refer to FIGS. 1 and 2. In this embodiment, a boss-type metal-based sandwich rigid-flex board is provided. The rigid-flex board includes a rigid sub-plate 101, a flexible sub-plate 103, a dielectric layer 105, and a metal core layer 104. The metal core layer has front and back sides on which at least one metal boss 102 (the metal boss is integrated with the metal core layer) and at least one heat dissipation area 106 are arranged respectively, the dielectric layer, and the rigid sub-plate and/or the flexible sub-plate are sequentially stacked on the front and back sides of the metal core layer respectively, and each of the rigid sub-plate, the flexible sub-plate and the dielectric layer is provided with a first window area fit with the metal boss, and a second window area corresponding to the heat dissipation area.

Each edge of the first window area has a size larger than each edge of the metal boss by 0.1-0.2 mm.

A difference between the thickness of the metal boss and a total thickness of the embracing dielectric layer, the rigid sub-plate and/or the flexible sub-plate is kept within ±20 μm. The rigid sub-plate is a single-layer rigid plate or a multi-layer rigid plate, and the flexible sub-plate is a single-layer flexible plate or a multilayer flexible plate.

Figure 3:
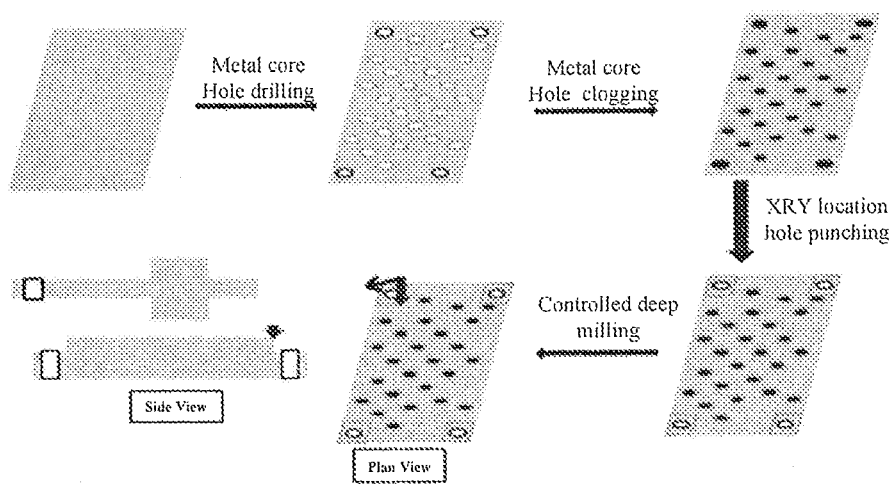
FIG. 3 is a flow diagram showing a preparation of a metal core layer.

(1) making a flexible sub-plate, obtained from a flexible board by inner circuit processing and windowing according to a conventional method;

(2) making a rigid sub-plate, obtained from a rigid board by inner circuit processing and windowing according to a conventional method;

(3) making a dielectric layer, obtained from a dielectric material by windowing according to a conventional method;

(4) making a metal core layer (see FIG. 3), including;

① performing hole drilling, hole clogging and location hole punching on a metal core plate;

② front side controlled deep milling, including performing controlled deep milling on the metal core plate obtained from the step of ①, to form a metal boss on a front side of the metal core plate; and ③ back side controlled deep milling, including mounting a backing plate on the front side of the metal core plate, and performing controlled deep milling a back side of the metal core plate, to form a metal boss on the back side, to complete the metal core layer. The backing plate has a thickness equal to that of the metal boss, and the backing plate is provided with a groove area fit with the metal boss. Each edge of the groove area has a size larger than each edge of the metal boss by 0.1-0.2 mm.

The backing plate is made of a material with a good dimension stability, such as Bakelite plate.

The processing of controlled deep milling has a precision of 0.1 mm.

Band plates including a front band plate for pulling and a back band plate for pushing are used before the laminating of the metal core layer. Each of the band plates is connected with the metal core layer through a adhesive tape. The band plate has a thickness greater than or equal to the sum of the heights of the upper and lower bosses and the thickness of the metal core layer. The band plate is made of a material which does not interact with pretreatment liquid, such as FR4.

Figure 4:
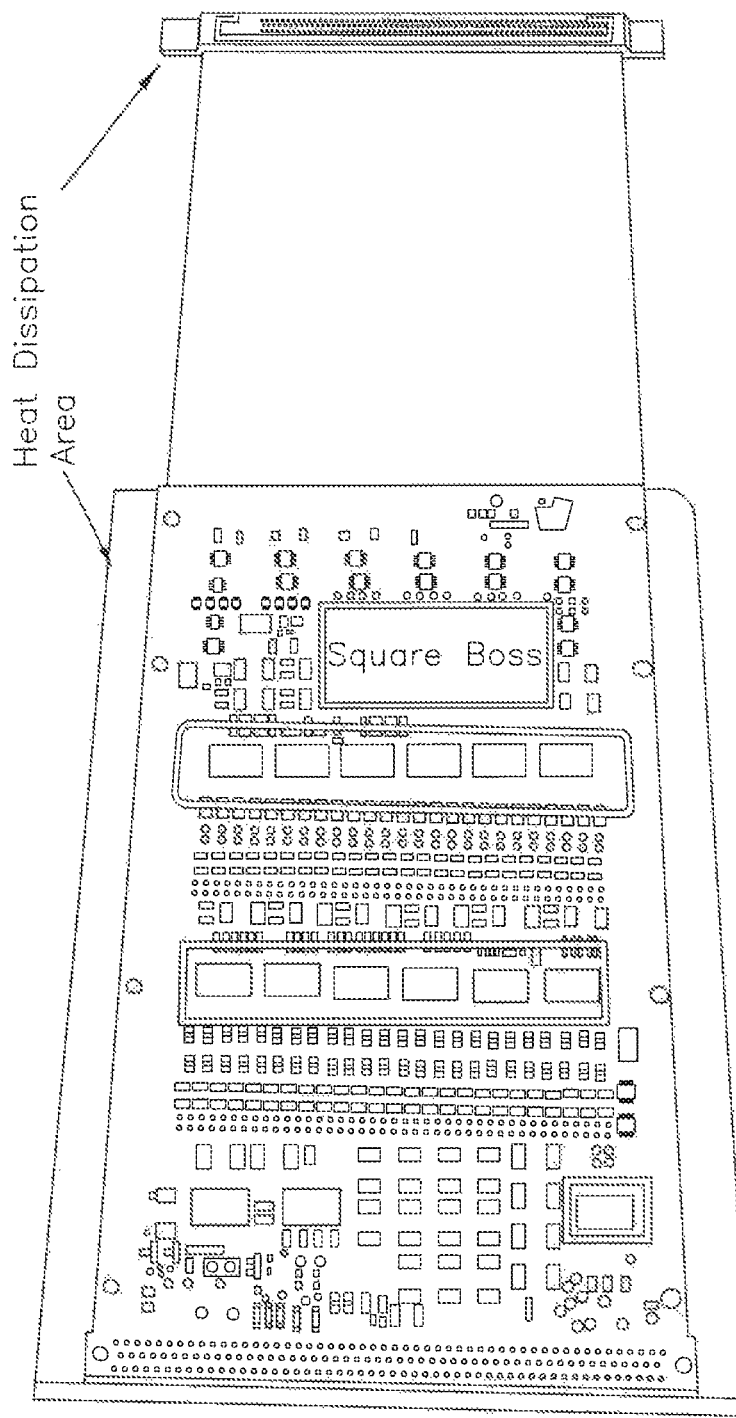
FIG. 4 is a schematic diagram showing a product of a boss-type metal-based sandwich rigid-flex board prepared by one embodiment.

(5) stacking the rigid sub-plate, the flexible sub-plate, the dielectric layer and the metal core layer sequentially according to design requirements, and performing laminating; and (6) performing subsequent processing as normal, and performing controlled deep milling and cover opening for the second window area after resistance welding, to obtain the Boss-type metal-based sandwich rigid-flex board (see FIG. 4).

The boss-type metal-based sandwich rigid-flex board prepared in this embodiment uses a metal core layer (with a metal boss arranged on each of the front and back sides) for heat dissipation. The metal core layer is sandwiched between any two neighboring internal layers. Such heat dissipation method not only satisfies the dissipation of heat from the electronic component locally heating (through the metal boss), but also satisfies the heat dissipation of the high density wirings at work. The heat dissipation efficiency is greatly improved compared with the common metal sandwich printed board (a common metal sandwich rigid-flex board has a heat dissipation efficiency of about 0.8-1.0 W/(m·k), while the boss-type metal-based sandwich rigid-flex board has a heat dissipation efficiency of about 180 W/(m·k) which has been improved by roughly two hundred times), and it has good reliability (□ the resistance variation is less than or equal to 5% on a temperature condition (−55□--125□) undergoing hot and cold cycle with the method described in test standards of Nation Military Standard of rigid plate (GJB326A-96) for 200 times, and there is no hole wall pulling away or separation of hole clogging resin from copper base; and □perform IST test by reference to the method of IPC-TM-650 2.6.26 with a loop for 100 times on a condition of the room temperature-150□, the resistance variation is less than or equal to 5%, and there is no hole wall pulling away or separation of hole clogging resin from copper base).

The above are embodiments of the disclosure described in detail, and should not be deemed as limitations to the scope of the present disclosure. It should be noted that variations and improvements will become apparent to those skilled in the art to which the present disclosure pertains without departing from its spirit and scope. Therefore, the scope of the present disclosure is defined by the appended claims.

The invention claimed is:

1. A method of preparing a boss-type metal-based sandwich rigid-flex board comprising the steps of:

making a flexible sub-plate, obtained from a flexible board by inner circuit processing and windowing;

making a rigid sub-plate, obtained from a rigid board by inner circuit processing and windowing;

making a dielectric layer, obtained from a dielectric material by windowing;

making a metal core layer, including:

performing hole drilling, hole clogging and location hole punching on a metal core plate;

performing front side controlled deep milling on the metal core plate to form a metal boss on a front side of the metal core plate; and performing back side controlled deep milling, including mounting a backing plate on the front side of the metal core plate, and performing controlled deep milling on a back side of the metal core plate to form a metal boss on the back side to complete the metal core layer;

stacking the rigid sub-plate, the flexible sub-plate, the dielectric layer and the metal core layer sequentially and performing laminating; and performing controlled deep milling to form a second window and cover opening for a window area in the laminated structure after resistance welding the metal core layer circuit of the flexible and rigid plates, to obtain the boss-type metal-based sandwich rigid-flex board.

2. The preparation method of claim 1, wherein the backing plate has a thickness equal to that of the metal boss, and the backing plate is provided with a groove area fit with the metal boss on the front side of the metal core plate.

3. The preparation method of claim 2, wherein each edge of the groove area has a size larger than each edge of the metal boss by 0.1-0.2 mm.

4. The preparation method of claim 1, wherein the processing of controlled deep milling has a precision of 0.1 mm.

* * * * *